United States Patent [19]

Scheibe

[11] Patent Number: 4,806,500
[45] Date of Patent: Feb. 21, 1989

[54] METHOD OF PRODUCING A LARGE-SCALE INTEGRATED MOS FIELD-EFFECT TRANSISTOR CIRCUIT

[75] Inventor: Adolf Scheibe, Ottobrunn, Fed. Rep. of Germany

[73] Assignee: Siemens Aktiengesellschaft, Berlin and Munich, Fed. Rep. of Germany

[21] Appl. No.: 40,617

[22] Filed: Apr. 21, 1987

Related U.S. Application Data

[63] Continuation-in-part of Ser. No. 713,471, Mar. 19, 1985, abandoned.

[30] Foreign Application Priority Data

Mar. 21, 1984 [DE] Fed. Rep. of Germany ....... 3410378

[51] Int. Cl.[4] .................... H01L 21/70; H01L 21/316
[52] U.S. Cl. ......................................... 437/57; 437/58; 437/34; 437/28; 437/239; 148/DIG. 118
[58] Field of Search ..................... 437/53, 34, 56, 58, 437/37, 57, 40, 238, 239; 357/41, 42; 148/DIG. 118

[56] References Cited

U.S. PATENT DOCUMENTS

4,110,899 10/1978 Nagasawa et al. .................... 437/34
4,471,373 10/1984 Shimizu et al. ........................ 357/41

OTHER PUBLICATIONS

Ghandhi, *VLSI Fabrication Principles*, John Wiley and Sons, 1983.

Primary Examiner—Brian E. Hearn
Assistant Examiner—M. Wilczewski
Attorney, Agent, or Firm—Herbert L. Lerner; Laurence A. Greenberg

[57] ABSTRACT

A method of producing a large-scale integrated MOS field effect transistor circuit which includes forming p and n-doped troughs, respectively, in a silicon substrate to accommodate respective n and p-channel transistors, introducing appropriate dopant atoms into the troughs by repeated ion implantations to adjust various transistor cutoff voltages, and masking the various ion implantations with photo resist structures and/or with silicon oxide and silicon nitride structures, respectively, and which includes forming source/drain and gate areas as well as forming intermediate and insulation oxide and a strip conductor plane in accordance with conventional MOS technology methods includes the steps of: applying a total-area oxide film having a first film thickness ($d1_G$); removing the oxide in a given area (II) associated with an n-channel transistor; and applying another, total-area oxide film in such a manner that, in anothedr area (III) associated with another n-channel transistor, the oxide film attains a final thickness ($d_G$) which is greater than the first film thickness ($d1_G$), may be followed by the steps of: applying a mask to a gate oxide with a window in a given area (II); implanting with first dopant atoms to produce n+ source/drain areas of a first n-channel transistor, dosage and implantation energy thereof being adapted to a second film thickness ($d3_G$) of the gate oxide; applying a mask to a gate oxide with a window in another area (III); implanting with second dopant atoms to produce an n+ source/drain area of a second n-channel transistor, the dosage and implantation energy thereof being adapted to a final thickness ($d_G$); removing that part of the gate oxide surface which is contaminated; and driving the implanted dopant atoms into the given area (II) and the other area (III).

9 Claims, 3 Drawing Sheets

METHOD OF PRODUCING A LARGE-SCALE INTEGRATED MOS FIELD-EFFECT TRANSISTOR CIRCUIT

BACKGROUND OF THE INVENTION

This is a continuation in part application of application Ser. No. 713,471, Mar. 19, 1985, abandoned.

FIELD OF THE INVENTION

The invention relates to a method of producing a large-scale integrated MOS field-effect transistor circuit (MOS circuit), which includes forming p and n-doped troughs, respectively, in a silicon substrate to accommodate respective n and p-channel transistors, introducing appropriate dopant atoms into the troughs by repeated ion implantations, to adjust various transistor cutoff voltages, and masking the various ion implantations with photo resist structures and/or with silicon oxide and silicon nitride structures, respectively, and which includes forming source/drain and gate areas as well as forming intermediate and insulation oxide and a strip conductor plane in accordance with conventional procedures of MOS technology. The invention relates further to a method of producing a large-scale integrated complementary MOS field-effect transistor circuit (CMOS circuit).

Modern CMOS processes are two-trough processes which, in their construction, are to be correlated with either a basic p or n-trough concept. This means that in an n or p-doped, large-area silicon substrate there are physical p and n-troughs, respectively.

The troughs are produced and the various transistor cutoff voltages (thin oxide and field oxide transistors in n and p-channel areas) are adjusted by several mutually matched ion implantations.

DESCRIPTION OF THE RELATED ART

The major differences and disadvantages of heretofore known CMOS production processes lie in the execution of these process steps. The course or performance of a conventional n-trough CMOS production process is described, for example, in an article by T. Ohzone et al in the U.S. journal, IEEE Trans. Electr. Dev., ED-27 No. 9 (1980), on pages 1789 to 1795.

Conventional MOS and CMOS production processes are generally optimized for a given operating voltage e.g. 5 V, and due to insufficient dielectric strength of the n-channel MOS transistors which are optimized for speed and characterized by small effective channel lengths and thin gate oxides, they do not afford application at higher voltages. It is desirable in many applications, however, also to integrate subcircuits for higher voltages in the MOS or CMOS semiconductor circuit constructed for a low operating voltage. Examples of such constructions are digital-to-analog converters or nonvolatile memories

SUMMARY OF THE INVENTION

Accordingly, it is an object of the invention to provide a method of producing a large-scale integrated MOS field-effect transistor having a high dielectric strength.

With the foregoing and other objects in view, there is provided in accordance with the invention, a method of producing a large-scale integrated MOS field-effect transistor circuit, which includes forming p and n-doped troughs, respectively, in a silicon substrate to accommodate respective n-and p-channel transistors, introducing appropriate dopant atoms into the troughs by repeated ion implantations to adjust various transistor cutoff voltages, and masking the various ion implantations with photoresist structures and/or with silicon oxide and silicon nitride structures, respectively, and which includes forming source/drain and gate areas as well as forming intermediate and insulation oxide and a strip conductor plane in accordance with conventional MOS-technology methods, which comprises the steps of:

(a) applying a total-area oxide film having a first film thickness ($d1_G$);

(b) removing the oxide in a given area (II) associated with an n-channel transistor; and (c) applying another, total-area oxide film in such a manner that, in another area (III) associated with another n-channel transistor, the oxide film attains a final thickness ($d_G$) which is greater than the first film thickness ($d1_G$).

In accordance with another feature of the invention, there is provided a method for producing a large-scale integrated, complimentary MOS field-effect transistor circuit, which includes, in the step (b), removing the oxide in an additional area (I) associated with a p-channel transistor.

In accordance with a further feature of the invention, there is provided a method which includes, in the step (c), selecting the oxidation conditions so that the gate oxide in the additional area (I) grows to a second film thickness ($d3_G$) which is smaller than a final thickness ($d_G$).

In accordance with an added feature of the invention, there is provided a method which includes growing the first film thickness ($d_G$) to about 65 nm and the final thickness ($d_G$) to about 80 nm.

In accordance with an additional feature of the invention, there is provided a method according to claim 3, which includes growing the second film thickness ($d3_G$) to about 40 nm.

In accordance with again another feature of the invention, there is provided a method of producing a large-scale integrated MOS field-effect transistor circuit which includes forming p and n-doped troughs, respectively, in a silicon substrate to accommodate respective n and p-channel transistors, introducing appropriate dopant atoms into the troughs by repeated ion implantations, to adjust various transistor cutoff voltages, and masking the various ion implantations with photo resist structures and/or with silicon oxide and silicon nitride structures, respectively, and which includes forming source/drain and gate areas as well as forming intermediate and insulation oxide and a strip conductor plane in accordance with conventional MOS-technology methods, which comprises the steps of:

(A) applying a mask to a gate oxide with a window in a given area (II);

(B) implanting with first dopant atoms to produce n+ source/drain areas of a first n-channel transistor, dosage and implantation energy thereof being adapted to a second film thickness ($d3_G$) of the gate oxide;

(C) applying a mask to a gate oxide with a window in another area (III);

(D) implanting with second dopant atoms to produce an n+ source/drain area of a second n-channel transistor, the dosage and implantation energy thereof being adapted to a final thickness ($d_G$);

(E) removing that part of the gate oxide surface which is contaminated; and (F) driving the implanted dopant atoms into the givn area (II) and the other area (III).

In accordance with again another feature of the invention, there is provided a method which includes replacing the step (D) with a step wherein dopant atoms identical to those of step (B) are implanted.

In accordance with again a further feature of the invention, there is provided a method which includes, in the step (F), driving the dopant toms into the given area (II) and the other area (III) by reversing the first and second dopant atoms used in the steps (B) and (D), respectively.

In accordance with still an added feature of the invention, there is provided a method wherein the first dopant atoms are arsenic+ atoms and the second dopant atoms are phosphorus+ atoms.

In accordance with a concomitant feature of the invention, there is provided a method of producing a large-scale integrated MOS field-effect transistor circuit which includes forming p and n-doped troughs, respectively, in a silicon substrate to accommodate respective n and p-channel transistors, introducing appropriate dopant atoms into the troughs by repeated ion implantations to adjust various transistor cutoff voltages, and masking the various ion implantations with photo resist structures and/or with silicon oxide and silicon nitride structures, respectively, and which includes forming source/drain and gate areas as well as forming intermediate and insulation oxide and a strip conductor plane in accordance with conventional MOS technology methods, which comprises the steps of:

(a) applying a total-area oxide film having a first film thickness ($d1_G$);

(b) removing the oxide in a given area (II) associated with an n-channel transistor; and (c) applying another, total-area oxide film in such a manner that, in another area (III) associated with another n-channel transistor, the oxide film attains a final thickness ($d_G$) which is greater than the first film thickness ($d1_G$), followed by the steps of:

(A) applying a mask to a gate oxide with a window in a given area (II);

(B) implanting with first dopant atoms to produce n+ source/drain areas of a first n-channel transistor, dosage and implantation energy thereof being adapted to a second film thickness ($d3_G$) of the gate oxide;

(C) applying a mask to a gate oxide with a window in another area (III);

(D) implanting with second dopant atoms to produce an n+ source/drain area of a second n-channel transistor, the dosage and implantation energy thereof being adapted to a final thickness ($d_G$);

(E) removing that part of the gate oxide surface which is contaminated; and (F) driving the implanted dopant atoms into the given area (II) and the other area (III).

The process of implantation is controlled by the parameters: acceleration voltage and the implantation dose. The acceleration voltage required is determined by the depth to which the doping atoms are to be inserted. In this regard the resistance of the substrate material to implantation and the types of layers being present at the upper surface of the substrate must be considered. In the instant case, the following layers are present atop the substrate, in the areas to be implanted, namely a silicon oxide layer and in the areas not to be implanted a layer of photo-sensitive lacquer. The acceleration voltage must therefore at any rate be selected such that the masking effect of the lacquer is retained.

Therefore, according to the desired manufacturing method, the implantation can be performed only with such a low acceleration voltage that the greater part of the ions to be implanted are stuck in the oxide layer, and must then, in a subsequent high-temperature process step be diffused out of the oxide and into the substrate, or else all the ions for the implantation must be driven into the substrate.

The number of ions to be implanted must be determined according to the process to be used. It is well known to those skilled in the art, that implanted ions perform no electrical function until they have been inserted into the silicon crystal grid through a high-temperature treatment, in which case they may operate as either acceptors or donors. A high-temperature treatment, however, causes the doping atoms to shift positions due to the diffusion, in regard to both the depth of penetration and also in regard to the lateral extension of the doping area. It is therefore impossible to predict precisely which further effects may be caused by the high-temperature diffusion process of the implanted ions. Each high-temperature diffusion treatment must therefore be measured i.e. controlled in regard to the acceleration voltage since each high-temperature treatment results in a change in the depth of penetration, therefore requiring a corresponding adjustment of the acceleration voltage. On the other hand, as stated above, the high-temperature treatment also results in a lateral expansion of the doped area, which causes the number of doping atoms in the original ion-implanted area to be reduced, which results in a higher resistance in that area, in turn requiring, if a certain resistance must be attained, a higher dose of ions must be implanted.

Only when generally accepted standards for the process are agreed upon by all fabricators, will it be meaningful to state firm values for the implantation dose.

Further still, the same reasons apply in regard to the thickness of the oxide layer, which is also an important criterion for the manufacturing process. The thickness of the oxide is determined by the required breakdown voltage for the transistor. The theoretical breakdown voltage for a thermally formed oxide is approximately 10 megavolt per centimeter, but if the fabrication process should tend to have faults therein, it is necessary to select a thicker oxide layer for the same breakdown voltage value. It therefore follows that the oxide thickness also depends on the fabrication process.

The oxide layer thickness accordingly depends upon the operating voltage of the integrated circuit, since the oxide layer must be able to withstand the operating voltage later to be applied to the device. In summary, the thickness of the oxide layer to be selected depends, on one hand upon the degree of control of the fabrication process, and on the other hand upon the selected operating voltage.

Since, furthermore, the oxide layer has a masking effect on the ion implantation, the ion implantation depends on the thickness of the oxide layer. All these parameters are usually obtained during the design process of the integrated circuit by means of a computer simulation process which includes usually in its program table recommendations for the implantation dose and acceleration voltage to be applied in order to attain a desired resistance value for the substrate under consideration of the oxide layer thickness on the substrate and the heat treatment later to be applied for the finishing of the circuit.

For the above stated reasons, the instant application provides only an oxide thickness value and a value for the acceleration voltage as well as the dose, which can be used by a person skilled in the art of integrated circuit fabrication as starting values, and which he may have to modify in accordance with the parameters of his manufacturing process.

The invention affords the advantage that subcircuits or circuit parts with n or p-channel transistors optimized for dielectric strength can be produced optimized for speed in a single semiconductor circuit for both MOS and CMOS circuits.

Because structural dimensions of and/or method steps for producing the entire semiconductor circuit are thus not required to be adjusted to the desired maximum operating voltage, the disadvantages as to the efficiency of the speed-determining n-channel transistors do not occur. Therefore, no increase in the channel length, no greater subdiffusion nor greater gate oxide thickness is required in comparison with standard circuits.

Other features which are considered as characteristic for the invention are set forth in the appended claims. Although the invention is illustrated and described herein as embodied in a method of producing a large-scale integrated MOS field-effect transistor circuit, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof will be best understood from the following description of specific embodiments, when read in connection with the accompanying drawings, in which.

DESCRIPTION OF THE PREFERRED EMBODIMENTS

Figure 1:
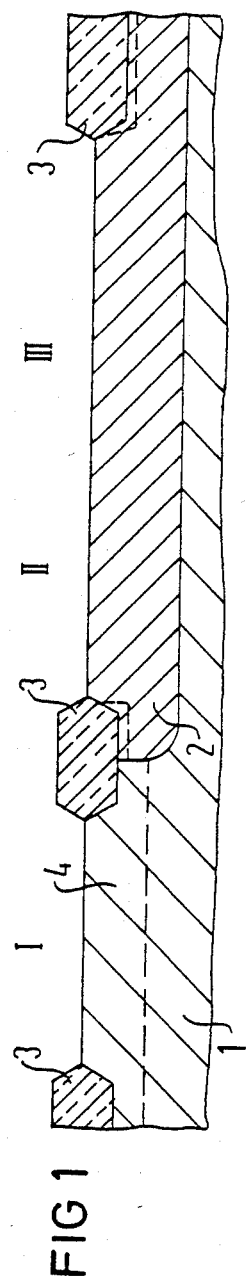
FIGS. 1 to 8 are cross-sectional views of a large-scale integrated MOS field-effect transistor circuit according to the invention, shown in successive developmental stages thereof, the illustrated embodiment being an n-channel transistor in CMOS technology.
Figure 2:
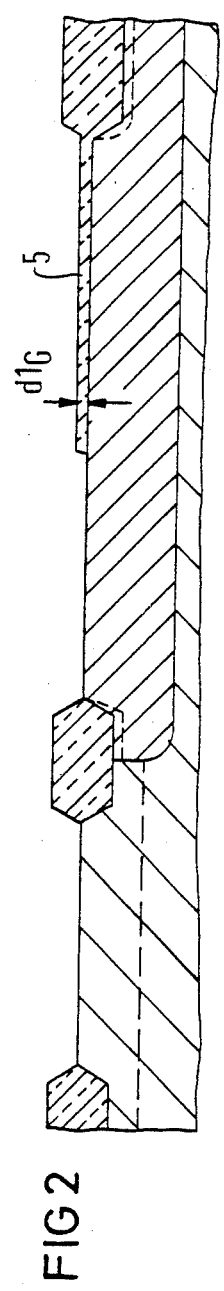
Figure 3:
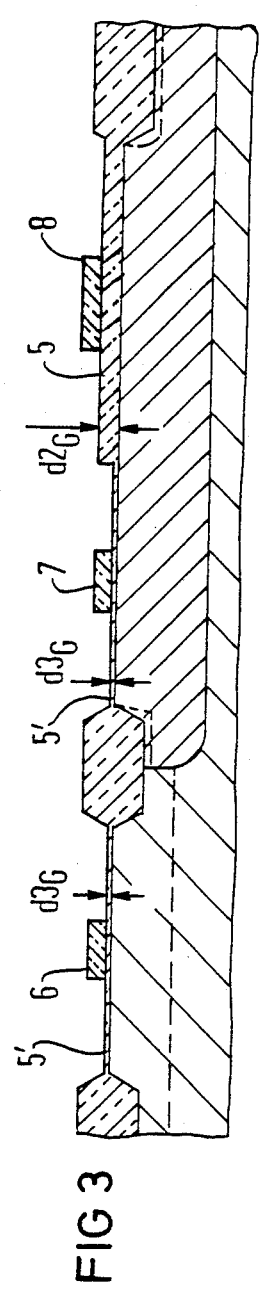

Referring now to the figures of the drawing, it is noted that conventional methods of CMOS process technology are applicable initially to the production of the circuit of the invention prior to the step of the method according to the invention which is represented in FIGS. 2 and 3, namely the formation of a gate oxide film 5,5'. In the interest of clarity, however, the prior-art structures formed by conventional procedures are not shown in FIG. 1 except for a p-trough 2 required in an n-doped silicon substrate 1 for n-channel transistors, an n-trough 4 required for p-channel transistors, and a field oxide 3. To indicate an exemplary order of magnitude for the integrated circuit according to the invention, it is noted that the field oxide 3 has a thickness of 0.9 mm.

The area in which the p-channel transistor is produced is designated as a first area I. In areas designated "II" and "III", the second and third areas, respectively, a speed-optimized and a voltage-optimized n-channel transistor are produced.

Following these procedures of a standard conventional process depicted in FIG. 1, the formation of a gate oxide 5 is shown in FIG. 2. The oxidation conditions are selected so that a first film thickness $d1_G$ covering the entire area is produced. The extent of this thickness $d1_G$ is such that, together with the oxidation carried out in the next step (FIG. 3) in area III, the gate oxide attains its final thickness. At a final thickness $d_G$ of, for example 80 nm, of the oxide in area III, a film of the first film thickness $d1_G = 65$ nm is produced in the first oxidation step described upon whichthere is oxidized another 15 nm thickness in the second oxidation step.

After the first oxidation step, the first oxide film 5 is removed again by etching in the area I and II so that the oxide film remains only in the area III. FIG. 2 shows this condition of the substrate surface. With respect to FIG. 3, in a second oxidation step, thereafter, another oxidation covering the entire area is carried out again. Due to this second oxidation step, the gate oxide 5 in the third area III grows to its final thickness $d2_G$, and at the same time a film 5' of the second film thickness $d3_G$ is produced in the two areas I and II.

Polysilicon with a thickness of, for example, 5 μm is then deposited on this surface. This deposit is then coated with a dopant. To structure electrodes 6, 7 and 8 out of the polysilicon, a mask is applied, followed by an etching and a resist removal operation. This is the starting condition preceding the steps of the method depicted in the following figures. As an alternative, the masking step may also include etching the exposed gate oxide in the areas II and III. But in this case, a thermal shielding oxide having a thickness of 20 to 30 nm, for example, must be applied before the next steps are performed, and implantation energy of implantation steps which follow must be adapted to this thickness.

The method steps described hereinbefore increase the dielectric strength of the transistor circuit which is produced. The manufacturing process can be concluded by conventional procedures, such as an arsenic implantation of the n+ source/drain areas II and III, as well as by the hereinafter described method steps, due to which the dielectric strength in the third area III is improved further. In addition, the circuit is speed-optimized in the second area II by the method steps described hereinafter. It must be noted that the following method is applicable as an alternative to the aforedescribed method, as well as in conjunction therewith.

Figure 4:
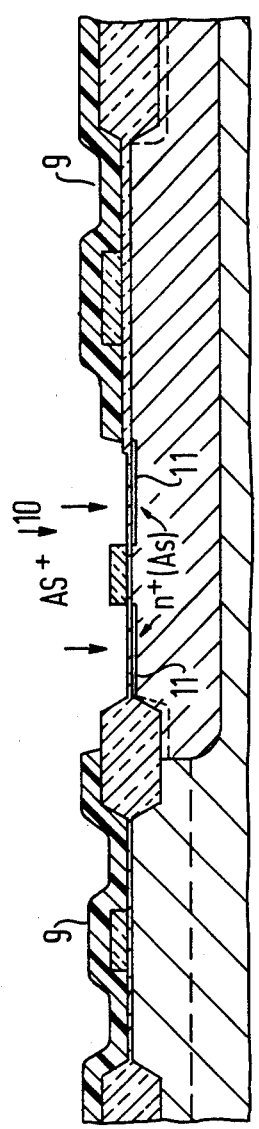

As shown in FIG. 4, a resist mask 9 is applied to form a window for a subsequent arsenic implantation 10 (first doping atoms) in the second area II. The implantation energy must be adapted to the third film thickness $d3_G$. For the example which has been previously repeatedly cited, a dose of $5 \times 10^{15}$ cm$^{-2}$ and an energy of 80 keV are set. Source/drain areas 11 are formed for the speed-optimized n-channel transistor which has less subdiffusion in comparison with a phosphor implantation.

Figure 5:
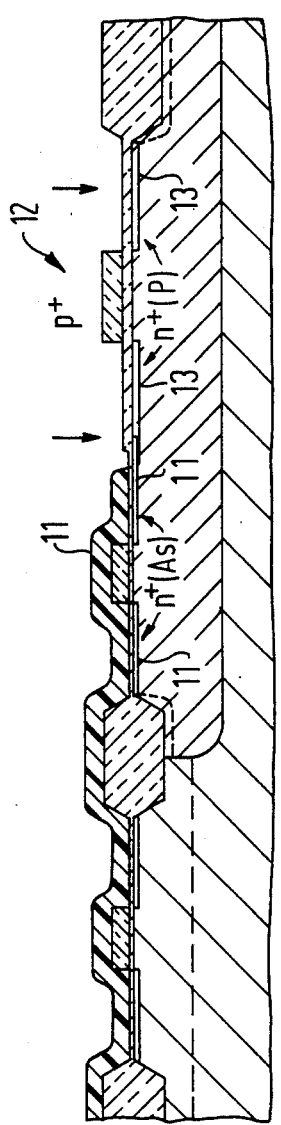

In FIG. 5, the mask 9 has been removed, another mask 11 has been applied and removed in the third area III to open a window for a phosphorus+implantation (second doping atoms).

Other methods may also be used if required by the technological goal, such as less subdiffusion.

The energy for the phosphorus implantation must be matched to the final thickness $d_G$ of the gate oxide 5. In the illustrated embodiment having a final thickness $d_G = 80$ nm, the energy is 100 keV and the doping less than or equal to $5 \times 10^{15}$ cm$^{-2}$.

The contaminated gate oxide or mask surface is removed in a short etching step.

Figure 6:
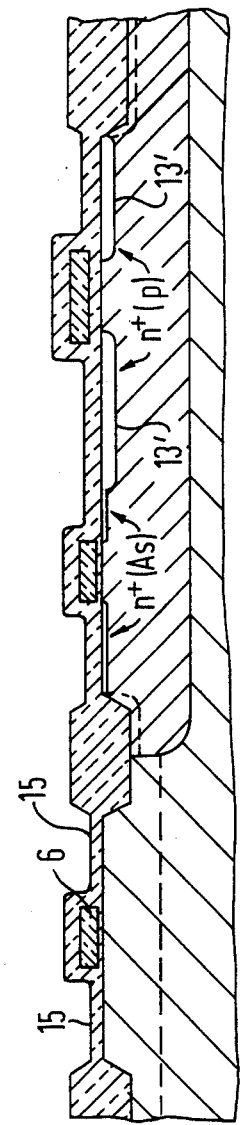

As shown in FIG. 6, the implated dopant atoms are then driven-in by a temperature step (so-called "drive in"). This produces, respectively, a source/drain zone 11 in the area II with little subdiffusion under the speed-optimized n-channel transistor, and a zone 13 in the third area III with more subdiffusion under the voltage-optimized n-channel transistor.

As an alternative thereto, this joint drive-in operation may be split and adapted to the respective goals for the doping concentration profiles of the source/drain areas 11 and 13 by executing a temperature step immediately after each implantation step, for example.

In the next-following total-area oxidation, a masking film 15, produced by oxidation on top of the oxide film 5′, in the face of the next p+ implantation. The oxidation conditions are selected so that the formation of the original oxide film 5′ occurring in the resulting p+-diffusion area, nevertheless assures adequate through-implantation.

Figure 7:
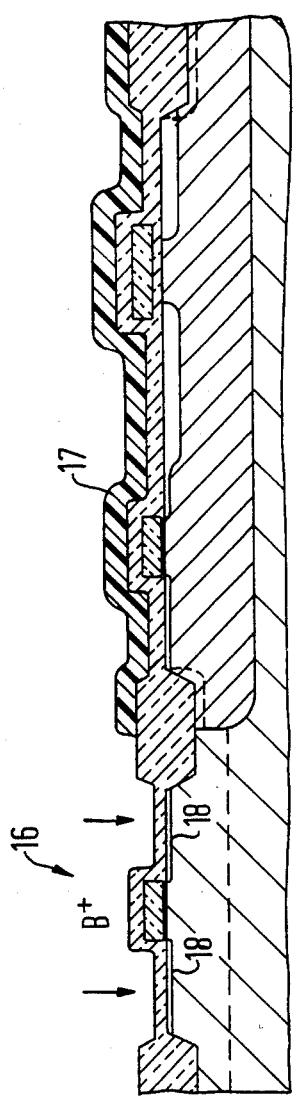

In FIG. 7, a resist mask 17 has been applied to the substrate in such a manner that a window remains open in the p+-diffusion area. A boron+ implantation is made, the energy of which is matched to the thickness of the oxide film 5 formed in the preceding oxidation step, source/drain areas 18 of the p-channel transistor being produced thereby.

Figure 8:
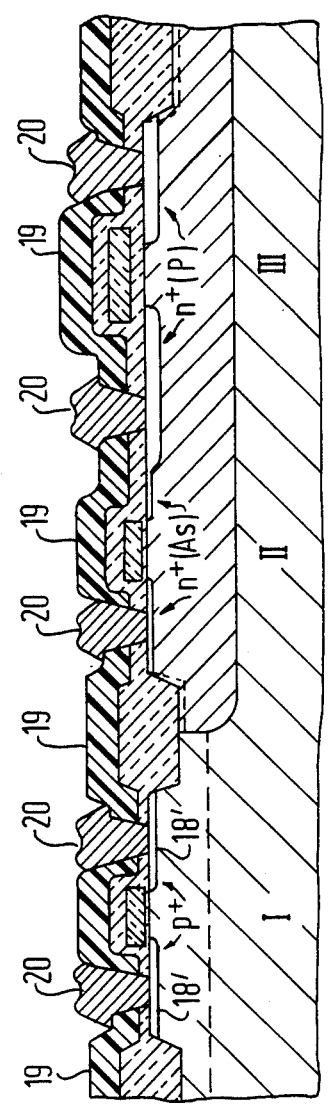

As depicted in FIG. 8, all further steps of the method invention such as applying an insulating oxide 19, producing contact holes and a metallic conductor strip plane 20 formed, for example, of aluminum or silicon, and passivating the circuit are executed in a conventional manner.

The method steps described with respect to FIGS. 4 through 7 of the drawing, create p-n junctions of a relatively large radius of curvature and/or a softer doping-concentration profile in the are of the subdiffusion of the n-channel transistor, which increases the voltage stress capacity.

As mentioned hereinbefore, the two methods of the invention described herein can be used both alternatively as well as in conjunction with one another.

I claim:

1. In a method for producing a large-scale integrated MOS field-effect transistor circuit which includes forming p and n-doped troughs, respectively, in a silicon substrate for forming respective n and p-channel transistors, introducing appropriate dopant atoms into the troughs by repeated ion implantations to adjust various transistor cutoff voltages, and masking the various ion implantations with photo resist structures and/or with silicon oxide and silicon nitrime structures, respectively, and which includes forming source/drain and gate areas as well as forming intermediate and insulation oxide and strip conductor plane in accordance with conventional MOS technology methods, the steps which comprise:
   (a) applying a total-area oxide film having a first film thickness ($d1_G$);
   (b) removing the oxide in a given area (II) associated with an n-channel transistor and in an additional area (I) associated with a p-channel transistor;
   (c) applying another, total-area oxide film in such a manner that, in another area (III) associated with another n-channel transistor, the oxide film attains a final thickness ($d_G$) which is greater than the first film thickness ($d1_G$);
   (d) applying a mask to a gate oxide with a window in a give area (II);
   (e) implanting with a first dopant of atoms of given diffusivity to produce n+ source/drain areas of a first n-channel transistor, dosage and implantation energy thereof being adapted to a second film thickness ($d3_G$) of the gate oxide;
   (f) applying a mask to a gate oxide with a window in another area (III);
   (g) implanting with second dopant atoms to produce an n+ source/drain area of a second n-channel transistor, the dosage and implantation energy thereof being adapted to a final thickness ($d_G$);
   (h) removing that part of the gate oxide which is contaminated; and
   (j) driving the implanted dopant atoms into the give area (II) and the other area (III).

2. In a method of producing a large-scale integrated, complementary MOS field-effect transistor circuit, which includes forming p and n-doped troughs for forming respective n- and p-channel transistors, introducing appropriate dopant atoms into the troughs by repeated ion implantations to adjust various transistor cutoff voltages, and masking the various ion implantations with photo resist structures and/or with silicon oxide and silicon nitride structures, respectively, and which includes forming source/drain and gate areas as well as forming intermediate and insulation oxide and a strip conductor plane in accordance with conventional MOS-technology methods, the steps which comprise:
   (a) applying a total-area oxide film having a first film thickness ($d1_G$);
   (b) removing the oxide in a given area (II) associated with an n-channel transistor and in an additional area (I) associated with a p-channel transistor;
   (c) applying another, total-arear oxide film in such a manner that, in another area (III) associated with another n-channel transistor, the oxide film attains a final thickness ($d_G$) which is greater than the first film thickness ($d1_G$);
   (d) applying a mask to a gate oxide with a window in a given area (II);
   (e) implanting with atoms of a first dopant of given diffusivity to produce n+ source/drain areas of a first n-channel transistor, dosage and implantation energy thereof being adapted to a second film thickness ($d3_G$) of the gate oxide;
   (f) applying a mask to a gate oxide with a window in another area (III);
   (g) implanting with atoms of a second dopant having a diffusivity differing from that of the first dopant to produce an n+ source/drain area of a second n-channel transistor, the dosage and implantation energy thereof being adapted to a final thickness ($d_G$) greater than that of the second film thickness ($d3_G$); and
   (h) driving the implanted dopant atoms into the give area (II) and the other area (III).

3. Method according to claim 2, for producing a large-scale integrated, complementary MOS field-effect transistor circuit, which includes, in the step (b), removing the oxide in an additional area (I) associated with a p-channel transistor.

4. Method according to claim 2, which includes, in the step (c), selecting the oxidation conditions so that the gate oxide in the additional area (I) grows to a second film thickness ($d_G$) which is smaller than a final thickness ($d_G$).

5. Method according to claim 4, which includes growing the second film thickness ($d3_G$) to about 40 nm.

6. Method according to claim 2, which includes growing the first film thickness ($d1_G$) to about 65 nm and the final thickness ($d_G$) to about 80 nm.

7. Method according to claim 2, which includes replacing the step (g) with a step wherein dopant atoms identical to those of step (e) are implanted.

8. Method according to claim 2, which includes, in the step (e), driving the dopant atoms into the give area (II) and the other area (III) by reversing the first and second dopant atoms used in the steps (e) and (g), respectively.

9. Method according to claim 2, wherein the first dopant atoms are arsenic+ atoms and the second dopant atoms are phosphorus+ atoms.

* * * * *